US007855616B2

(12) United States Patent
Lee et al.

(10) Patent No.: US 7,855,616 B2
(45) Date of Patent: Dec. 21, 2010

(54) RADIO FREQUENCY SWITCH

(75) Inventors: Kang-hyun Lee, Gyeonggi-do (KR);
Gil-ho Lee, Gyeonggi-do (KR)

(73) Assignee: KMW Inc. (KR)

( * ) Notice: Subject to any disclaimer, the term of this patent is extended or adjusted under 35 U.S.C. 154(b) by 207 days.

(21) Appl. No.: 12/161,606

(22) PCT Filed: Mar. 10, 2006

(86) PCT No.: PCT/KR2006/000869

§ 371 (c)(1),
(2), (4) Date: Jul. 21, 2008

(87) PCT Pub. No.: WO2007/083861

PCT Pub. Date: Jul. 26, 2007

(65) Prior Publication Data

US 2009/0206908 A1    Aug. 20, 2009

(30) Foreign Application Priority Data

Jan. 20, 2006    (KR) .................. 10-2006-0006496

(51) Int. Cl.
*H01P 1/10*    (2006.01)
*H01P 5/20*    (2006.01)
*H01P 3/08*    (2006.01)

(52) U.S. Cl. .................. 333/103; 333/121; 333/246
(58) Field of Classification Search ............ 333/101, 333/103, 104, 121, 122, 125, 246, 247
See application file for complete search history.

(56) References Cited

U.S. PATENT DOCUMENTS 3,946,339 A * 3/1976 Oltman et al. .............. 333/121

(Continued)

FOREIGN PATENT DOCUMENTS

EP    0023873 A    2/1981

(Continued)

OTHER PUBLICATIONS

Hettak, K. et al., A 38-GHz Integrated Uniplanar Subsystem for High-Speed Wireless Broad-Band Multimedia Systems; IEEE: Transactions on Microwave Theory and Techniques; Jun. 1, 1999; pp. 935-942; vol. 47, No. 6.

*Primary Examiner*—Dean O Takaoka
(74) *Attorney, Agent, or Firm*—John G. Fischer, Esq.; Paul V. Storm, Esq.; Storm LLP (57) ABSTRACT

An RF switch includes first, second and third transmission lines for forming ports, respectively, and first, second and third slot line pattern portions connected to one another, for transferring signals to the first, second and third transmission lines, respectively. The first slot line pattern portion has a slot line pattern for transferring a signal received from the first transmission line to a connection point with the other slot line pattern portions, and a switching circuit for shorting the gap of a corresponding slot line and thus blocking the signal transfer. The second slot line pattern portion includes a loop slot line formed by a first and a second half loop slot line, a second sub-slot line for transferring a signal received from the connection point to the second transmission line through the loop slot line, and a switching circuit for shorting the gap of a corresponding slot line.

10 Claims, 5 Drawing Sheets

U.S. PATENT DOCUMENTS

| | | | |
|---|---|---|---|
| 5,909,641 A | 6/1999 | Simmons | |
| 6,115,585 A | 9/2000 | Matero et al. | |
| 6,487,395 B1 | 11/2002 | Durec et al. | |
| 6,657,600 B2 * | 12/2003 | Thudor et al. | 343/770 |
| 7,057,568 B2 * | 6/2006 | Louzir et al. | 343/767 |
| 7,564,323 B2 * | 7/2009 | Kim et al. | 333/103 |
| 2003/0102942 A1 | 6/2003 | Aikawa et al. | |
| 2009/0315639 A1 * | 12/2009 | Lee et al. | 333/108 |
| 2010/0008267 A1 * | 1/2010 | Moon et al. | 370/280 |

FOREIGN PATENT DOCUMENTS

| | | |
|---|---|---|
| EP | 0 921 642 A2 | 6/1999 |
| GB | 2121239 A | 12/1983 |
| JP | 54104719 A | 8/1979 |
| JP | 60172864 A | 9/1985 |
| JP | 05-252074 A | 9/1993 |
| JP | 5252075 | 9/1993 |
| JP | 6140959 | 5/1994 |
| SU | 1255321 A1 | 9/1986 |

* cited by examiner

RADIO FREQUENCY SWITCH

BACKGROUND OF THE INVENTION

1. Field of the Invention

The present invention relates generally to an RF switch, and in particular, to an RF switch suitable as a switch for switching between a transmission signal and a received signal at a signal Tx/Rx end in a Time Division Duplexing (TDD) system.

2. Description of the Related Art $2^{nd}$ and $3^{rd}$ generation mobile communication systems are mostly based on Frequency Division Duplexing (FDD). A duplexer separates a Tx signal from an Rx signal in FDD. In comparison, $3.5^{th}$ and $4^{th}$ generation mobile communication systems are expected to use TDD.

In time-division transmission schemes including TDD, communications are carried out with the same radio frequency in time division between transmission and reception. One frame is divided for transmission and reception, for bi-directional communications at one frequency.

Figure 1:
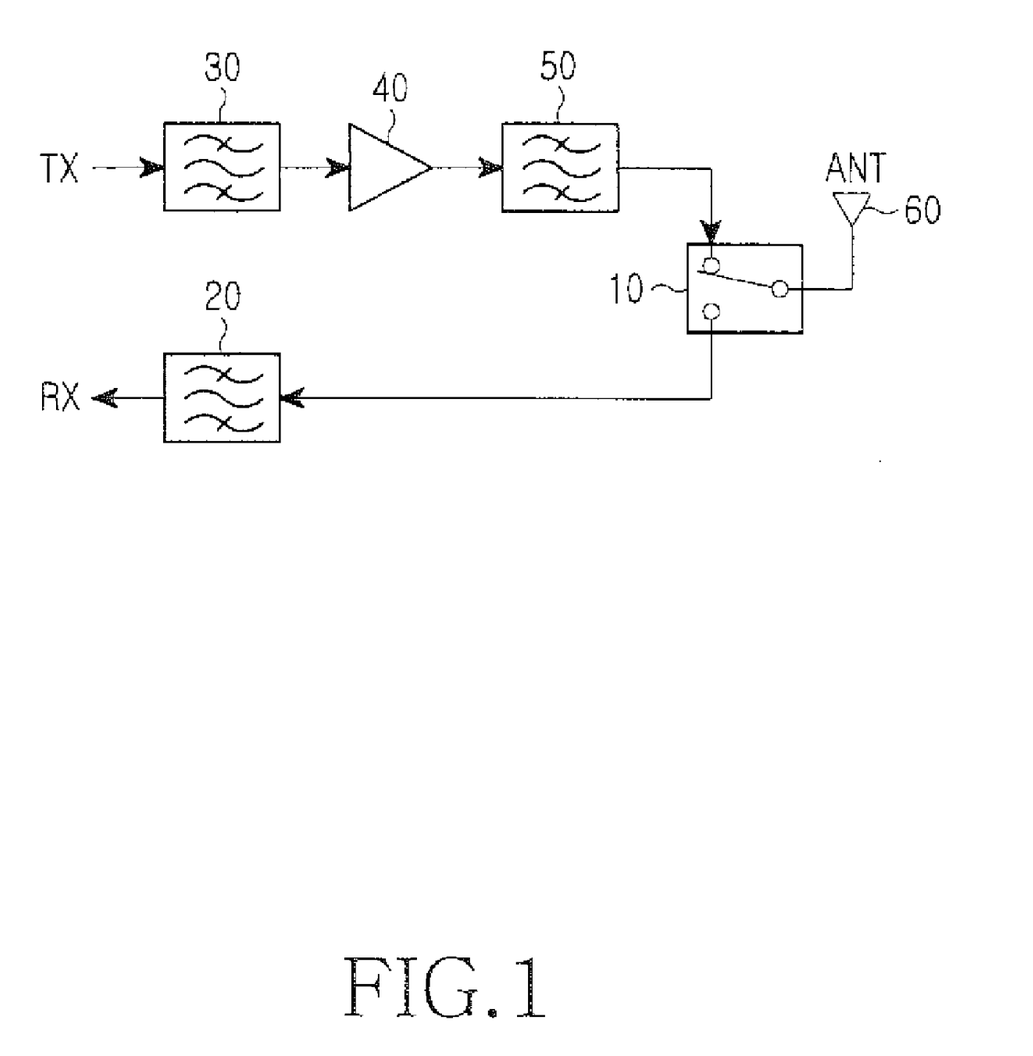
FIG. 1 is a block diagram of exemplary transmission (Tx) and reception (Rx) ends in a typical TDD system.

FIG. 1 is a block diagram of Tx and Rx ends in a typical TDD system. Referring to FIG. 1, a Tx signal is amplified to an appropriate power level in a power amplifier 40 and then radiated through an antenna (ANT) 60 through a Tx-Rx switch 10 and a full-band filter 50. For reception, a signal received through the ANT 60 passes through the full-band filter 50 and the Tx-Rx switch 10 and then is amplified to an appropriate power level in a Rx power amplifier (e.g. LNA) 20. The Tx-Rx switch 10 switches between transmission and reception according to a switching control signal received from a controller (not shown).

As described above, transmission alternates with reception on the same frequency every predetermined time period. That's why a high-speed Tx-Rx RF switch is needed.

Due to the requirement of high-speed switching, the RF switch uses a switch based on a semiconductor device such as a PIN diode or a Field Effect Transistor (FET) rather than a mechanical switch. However, the semiconductor switch is not feasible for high power because of the vulnerability of semiconductor to high power.

When a high power is applied, much heat is created and thus without sufficient heat proofness, the switch is destroyed. An RF switch developed to withstand high power is equipped with a separately procured cooler and thus the RF switch is very expensive and hard to fabricate. Therefore, the RF switch is limited to military use.

To solve this problem, the TDD system typically adopts a circulator instead of an RF switch to separate a Tx signal from an Rx signal. However, the use of the circulator also has the distinctive drawback that sufficient isolation from a Tx signal during reception is difficult to achieve and in an open state caused by some defects in an antenna during transmission, the Tx signal is introduced into a receiver, thereby causing system malfunction or seriously decreasing the quality of the Rx signal. Also, Tx Passive Intermodulation Distortion (PIMD) is caused, thereby adversely affecting propagation quality from other service providers.

SUMMARY OF THE INVENTION

An object of the present invention is to substantially solve at least the above problems and/or disadvantages and to provide at least the advantages below. Accordingly, an object of the present invention is to provide an RF switch suitable for Tx-Rx switching in a TDD system for ensuring sufficient isolation between a Tx end and an Rx end.

Another object of the present invention is to provide an RF switch suitable for Tx-Rx switching in a TDD system for preventing introduction of Tx power into an Rx end even when there are problems with a DC power used for a control operation.

A further object of the present invention is to provide an RF switch using a semiconductor device but having sufficient heat-proofness, for stably operating at high power.

Still another object of the present invention is to provide an RF switch easily fabricated in the form of a Microwave Integrated Circuit (MIC).

Yet another object of the present invention is to provide an RF switch for operating even in an RF band of tens of giga hertz or above as well as in a mobile communication frequency band.

The above objects are achieved by providing a radio frequency switch. In the radio frequency switch, first, second and third transmission lines form first, second and third ports. First, second and third slot line pattern portions are connected to one another, for signal transferring with the first, second and third transmission lines. The first slot line pattern portion includes a slot line pattern for providing a signal received from the first transmission line to a connection to the other slot line pattern portions, and a switching circuit installed at a predetermined position of the slot line pattern, for blocking a signal by shorting the gap of a slot line according to an external control signal. The second slot line pattern portion includes a loop slot line formed by a first half loop slot line and a second half loop slot line, for signal transferring between a portion thereof and the second transmission line, a second sub-slot line for providing a signal received from the connection to the other slot line pattern portions to the second transmission line through the loop slot line, and a switching circuit installed at a predetermined position of a slot line pattern, for blocking a signal by shorting the gap of a slot line according to an external control signal.

DETAILED DESCRIPTION OF THE PREFERRED EMBODIMENT

Preferred embodiments of the present invention will be described herein below with reference to the accompanying drawings. In the following description, well-known functions or constructions are not described in detail since they would obscure the invention in unnecessary detail.

Figure 2:
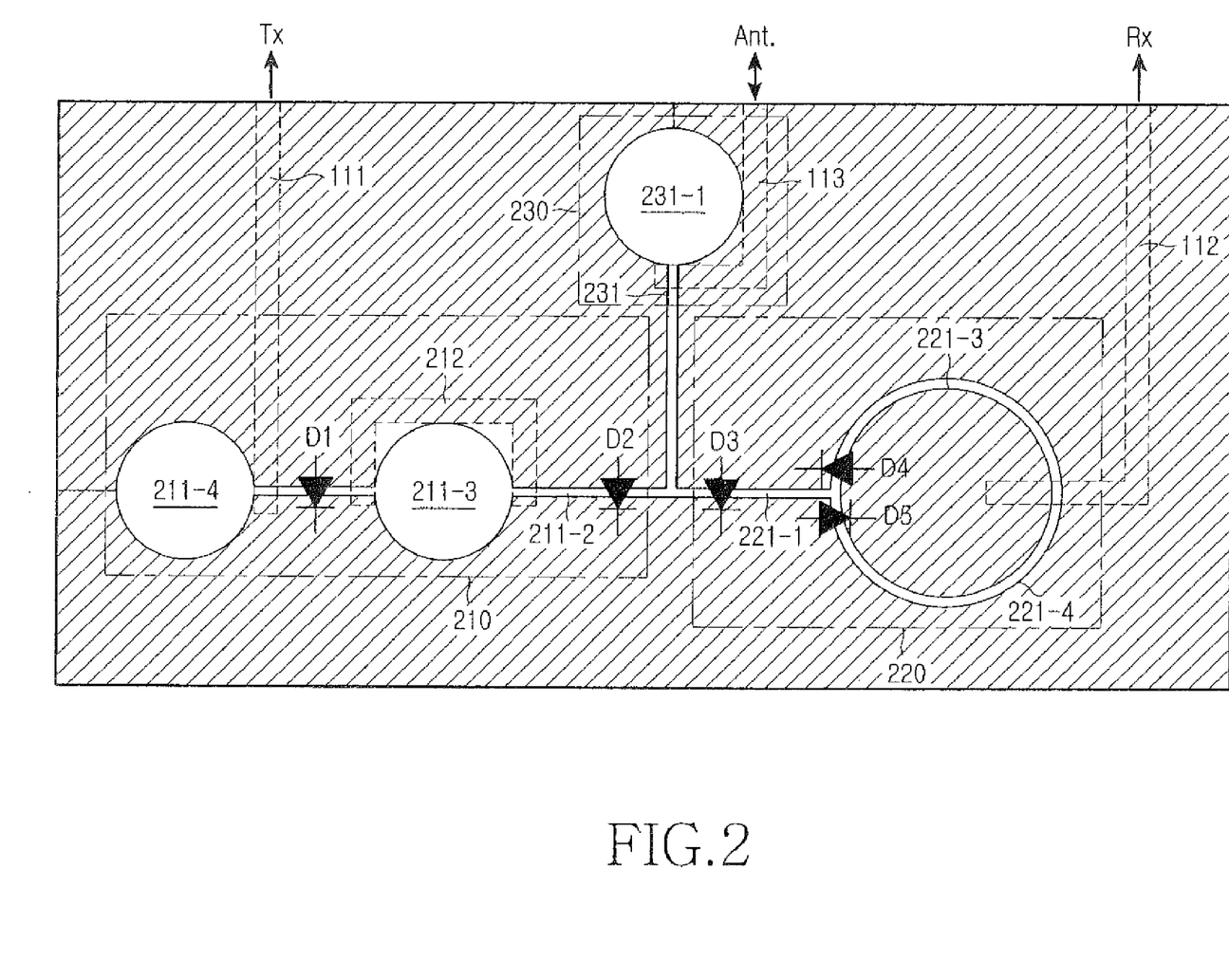
FIG. 2 is a plan view of the circuit pattern of the Printed Circuit Board (PCB) of a Radio Frequency (RF) switch for Tx-Rx switching in a TDD system according to an embodiment of the present invention.
Figure 3:
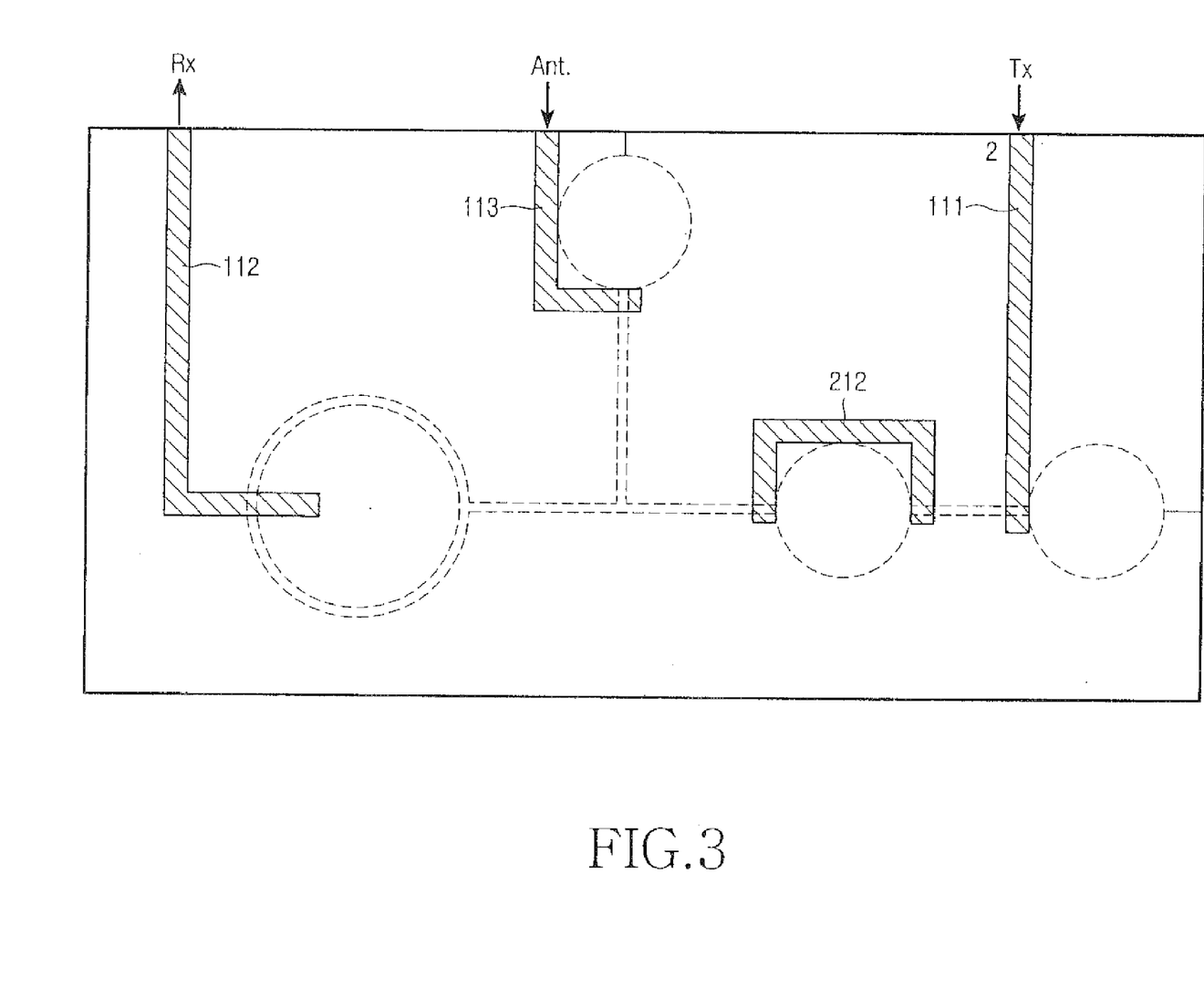
FIG. 3 is a bottom view of the circuit pattern of the PCB illustrated in FIG. 2.

FIG. 2 is a plan view of one surface (top surface, for convenience' sake) of the circuit pattern of the PCB of an RF switch for Tx-Rx switching in a TDD system according to an embodiment of the present invention and FIG. 3 is a view of the other surface (bottom surface, for convenience' sake) of the circuit pattern of the PCB illustrated in FIG. 2. The size and shape of each component is more or less enlarged or simplified for better understanding. Referring to FIGS. 2 and 3, an RF switch according to an embodiment of the present invention may have microstrip lines and slot lines formed into appropriate patterns on a single dielectric substrate.

In the RF switch of the present invention, first, second and third microstrip lines 111, 112 and 113 are formed into appropriate patterns on the lower surface of the dielectric substrate. These microstrip lines serve as first, second and third ports for the RF switch. The RF switch selectively switches the first or second port to the third port. First, second and third slot line pattern portions 210, 220 and 230 are formed on the upper surface of the dielectric substrate, such that signals can be transferred at appropriate positions between the first, second and third slot line pattern portions 210, 220 and 230, and the first, second and third microstrip lines 111, 112 and 113 by microstrip-slot line coupling. These slot line pattern portions 210, 220 and 230 are connected to one another at one position like a T-junction slot line structure.

Signal transfer takes place between the first slot line pattern portion 210 and the first microstrip line 111. The first slot line pattern portion 210 is so patterned as to provide the signal transferred from the first microstrip line 111 to a connection to the other slot line pattern portions 220 and 230. The first slot line pattern portion 210 is provided, at an appropriate position, with a switching circuit D1 and D2 configured to block signals by shorting the gap of corresponding slot lines in response to an external switching control signal.

The configuration of the first slot line pattern portion 210 will be described in more detail. The first slot line pattern portion 210 is provided at an end thereof, with an open-end circuit 211-4. It also includes a 1-1 sub-slot line 211-1 configured to enable signal transfer with the first microstrip line 111 and a 1-2 sub-slot line 211-2 connected to the connection to the second and third slot line pattern portions 220 and 230. The other ends of the 1-1 and 1-2 sub-slot lines 211-1 and 211-2 are connected to both ends of a common open-end circuit 211-3. A sub-microstrip line 212 is formed on the lower surface of the dielectric substrate corresponding to a connection between the 1-1 and 1-sub-slot lines 211-1 and 211-2, so that signals are transferred between both ends of the sub-microstrip line 212 and the 1-1 and 1-2 sub-slot lines 211-1 and 211-2 by microstrip-slot line coupling. The switching circuit may include a plurality of semiconductor switch devices, for example, first and second diodes D1 and D2. The first diode D1 is installed at an appropriate position of the 1-1 sub-slot line 211-1 so as to short the gap of the 1-1 sub-slot line 211-1. The second diode D2 is installed at an appropriate position of the 1-2 sub-slot line 211-2 so as to short the gap of the 1-2 sub-slot line 211-2.

The second slot line pattern portion 220 has a loop slot line 221-3 and 221-4 formed by a first half loop slot line 221-3 and a second half slot line 221-4, for transferring a signal from one portion thereof to the second microstrip line 112. The second slot line pattern portion 220 further includes a second sub-slot line 22-1 for transferring a signal received form the connection to the other slot line pattern portions 210 and 230 to the second microstrip line 112 via the loop slot line 221-3 and 221-4, and a switching circuit D3, D4 and D5 installed at an appropriate position of a corresponding slot line, for shorting the gap of the slot line in response to an external switching control signal and thus blocking a signal.

To be more specific, the switching circuit of the second slot line pattern portion 220 includes a third diode D3 installed at an appropriate position of the second sub-slot line 221-1, for shorting the gap of the second sub-slot line 221-1 according to the external switching control signal, and fourth and fifth diodes D4 and D5 installed in the vicinity of a connection between the first half loop slot line 221-3 and the second sub-slot line 221-1 and a connection between the second half sloop slot line 221-4 and the second sub-slot line 221-1, for shorting the gaps the first and second half loop slot lines 221-3 and 221-4 according to the external switching control signal. The second microstrip line 112 is configured to have an open end extended for a length of λ/8 from the intersection of the second microstrip line 112 and the loop slot line 221-3 and 221-4 such that the magnetic field for signal transferring is maximized at this intersection.

Signals are transferred between the third slot line pattern portion 230 and the third microstrip line 113. The third slot line pattern portion 230 is configured to have an appropriate slot line pattern for providing a signal received form the first microstrip line 113 to the connection to the other slot line pattern portions 210 and 220. That is, the third slot line pattern portion 230 is provided, at an end thereof, with an open-end circuit 231-1. It further includes a third slot line 231 through which a signal is transferred to/from the third microstrip line 113.

In the above RF switch configuration, the first and third microstrip lines 111 and 113 and the sub-microstrip line 212 may be provided, at ends thereof, with open-end or short-end circuits. A short-end circuit can be formed by forming a circular hole at an end of a microstrip line and plating the inside of the hole with a conductive plating material to be connected to a ground substrate on the surface with the slot line patterns formed thereon.

The switching control signal can be generated by applying, for example, +5V/−5V to individual switching devices or via an appropriately electrically isolated ground substrate so that the switching devices can be turned on/off.

The RF switch having the above-described configuration can be used for Tx-Rx switching in a TDD system by connecting the first, second and third ports of the first, second and third microstrip lines 111, 112 and 113 to a Tx end, an Rx end, and an antenna (Ant) end, respectively.

The operation of the RF switch having the configuration illustrated in FIGS. 2 and 3 as a Tx-Rx switch in the TDD system will be described below. For transmission, the third diode D3 is turned off (all the other diodes can be turned on) and an RF Tx signal is applied to the first port of the Tx end. Then the Tx signal travels along the first microstrip line 111, the 1-1 sub-slot line 211-1, the sub-microstrip line 212, and the 1-2 sub-slot line 211-2. Since the third diode D3 is on, the gap of the second sub-slot line 221-1 at both ends of the third diode D3 is shorted, thereby blocking the Tx signal. Meanwhile the Tx signal is transferred along the third slot line 231 and transmitted to the antenna through the third port.

Regarding the isolation function of the second port of the Rx end, primary signal blocking is performed by the third diode D3. If any signal is introduced to the second sub-slot line 221-1 in this state, the signal is distributed to the first and second half loop slot lines 221-3 and 221-4, the distributed signals having a phase difference of 180 degrees, because the fourth and fifth diodes D4 and D5 are off. The distributed signals are nullified due to the 180-degree phase difference at a position where they are combined, that is, a position where signal transferring to the 1-2 sub-slot line 112 occurs. Thus, secondary signal blocking is performed.

For reception, the first and second diodes D1, D2 and the fourth diode D4 (or the fifth diode D5) are turned on. When a signal is received from the third port of the antenna end through the third microstrip line 113 and the third slot line 231, the Rx signal is blocked from the first slot line pattern portion 210 because the first and second diodes D1 and D2 are on and the Rx signal is blocked from the 1-1 and 1-2 slot lines 211-1 and 211-2. Meanwhile, the Rx signal is transferred to the second sub-slot line 221-1 of the second slot line pattern portion 220. Since the fourth diode D4 is on, the Rx signal is transferred to the second microstrip line 112 through the second half loop slot line 221-4.

Even if all diodes are turned off due to a problem with an operational DC power for controlling the switching devices, the RF switch configuration of the present invention ensures isolation of the Rx end. That is, when the DC power abnormality occurs, a Tx signal input to the first port of the Tx end is introduced to the Rx end through the second sub-slot line 221-1, distributed to the first and second half loop slot lines 221-3 and 221-4, with a phase difference of 180 degrees, and then nullified where they are combined due to the 180-degree phase difference.

Figure 4:
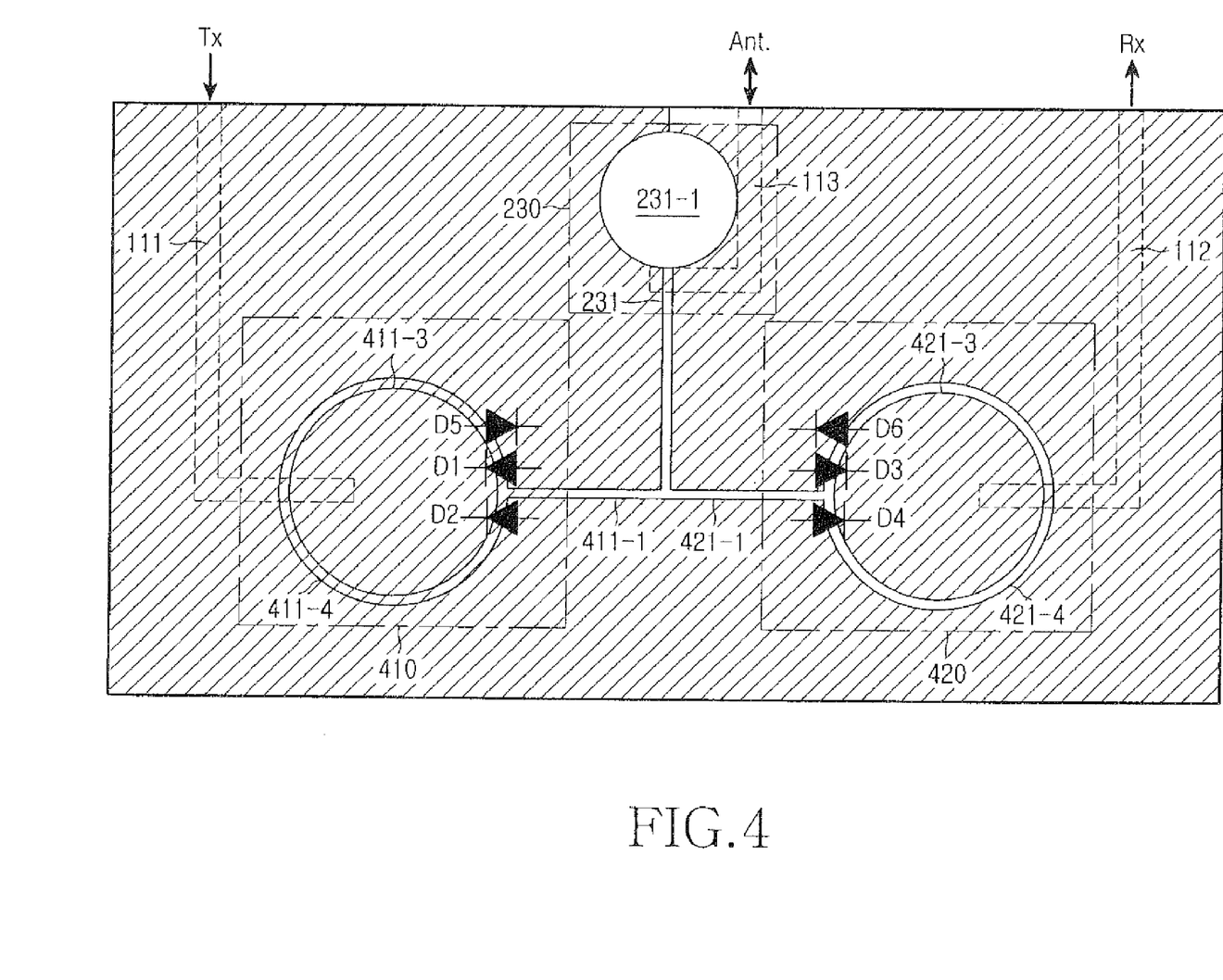
FIG. 4 is a plan view of the circuit pattern of the PCB of an RF switch for Tx-Rx switching in a TDD system according to another embodiment of the present invention.

FIG. 4 is a plan view of one surface (top surface) of the circuit pattern of the PCB of an RF switch for Tx-Rx switching in a TDD system according to another embodiment of the present invention. The RF switch according to the second embodiment of the present invention is similar to that illustrated in FIGS. 2 and 3 in configuration. In the RF switch according to the second embodiment of the present invention, the first, second and third microstrip lines 111, 112 and 113 are formed into appropriate patterns on the lower surface of a dielectric substrate. First, second and third slot line pattern portions 410, 420 and 430 are formed on the upper surface of the dielectric substrate, such that signals can be transferred at appropriate positions between the first, second and third slot line pattern portions 410, 420 and 230, and the first, second and third microstrip lines 111, 112 and 113 by microstrip-slot line coupling and a Tx path and an Rx path are appropriately formed according to a switching control signal. These slot line pattern portions 410, 420 and 230 are connected to one another at one position like a T-junction slot line structure.

The third slot line pattern portion 230 is the same as its counterpart illustrated in FIGS. 2 and 3 in configuration and operation.

Like the second slot line pattern portion 220 illustrated in FIGS. 2 and 3, the second slot line pattern portion 420 has a loop slot line 421-3 and 421-4 formed by a first half loop slot line 421-3 and a second half slot line 421-4, and a second sub-slot line 421-1. The second slot line pattern portion 420 differs from the second slot line pattern portion 220 in switching circuit structure. The switching circuit of the second slot line pattern portion 420 includes third and fourth diodes D3 and D4 installed in the vicinity of a connection between the first half loop slot line 421-3 and the second sub-slot line 421-1 and a connection between the second half sloop slot line 421-4 and the second sub-slot line 421-1, for shorting the gaps the first and second half loop slot lines 421-3 and 421-4 according to an external switching control signal, and a sixth diode D6 configured to short the gap of the first half loop line 421-3 according to the external control signal, separately from the third diode D3.

Compared to the first slot line pattern portion 210 illustrated in FIGS. 2 and 3, the first slot line pattern portion 410 illustrated in FIG. 4 is configured to be symmetrical to the second slot line pattern portion 420. That is, the first slot line pattern portion 410 has a loop slot line 411-3 and 411-4 formed by a first half loop slot line 411-3 and a second half slot line 411-4, and a first sub-slot line 411-1. Signals are transferred between one portion of the loop slot line 411-3 and 411-4 and the first microstrip line 111. The first sub-slot line 411-1 transfers a signal received from the first microstrip line 111 through the loop slot line 411-3 and 411-4 to a connection to the other slot line pattern portions 410 and 430. The first microstrip line 111 is configured to have an open end extended for a length of λ/8 from the intersection of the first microstrip line 111 and the loop slot line 411-3 and 411-4 such that the magnetic field for signal transferring is maximized at this intersection. A switching circuit for the first slot line pattern portion 410 includes first and second diodes D1 and D2 installed in the vicinity of a connection between the first half loop slot line 411-3 and the first sub-slot line 411-1 and a connection between the second half sloop slot line 411-4 and the first sub-slot line 411-1, for shorting the gaps the first and second half loop slot lines 411-3 and 411-4 according to the external switching control signal, and a fifth diode D5 configured to short the gap of the first half loop line 411-3 according to the external control signal, separately from the first diode D1.

The operation of the RF switch having the configuration as a Tx-Rx switch in the TDD system will be described below. For transmission, the third, fourth and fifth diodes D3, D4 and D5 are turned on (all the other diodes are turned off) and an RF Tx signal is applied to the first port of the Tx end and travels along the first microstrip line 111. Since the fifth diode D5 is on, the Tx signal is transmitted along the second half loop slot line 411-4 and the first sub-slot line 411-1. The Tx signal is blocked since the third and fourth diodes D3 and D4 are on, while it travels along the third slot line 231 and then transmitted to the antenna end through the third port.

For reception, the first and second diodes D1, D2 and the sixth diode D6 are turned on. When a signal is received from the third port of the antenna end through the third microstrip line 113 and the third slot line 231, the Rx signal is blocked from the first slot line pattern portion 410 because the first and second diodes D1 and D2 are on. Meanwhile, the Rx signal is transferred to the second sub-slot line 421-1 of the second slot line pattern portion 420. Since the sixth diode D6 is on, the Rx signal is transferred to the second microstrip line 112 through the second half loop slot line 421-4.

When a problem occurs to all operational DC power for controlling switching devices, a Tx signal input to the first port of the Tx end is distributed to the first and second half loop slot lines 411-3 and 411-4 of the first slot line pattern portion 410, with a phase difference of 180 degrees, and then primarily nullified where they are combined due to the 180-degree phase difference. If any signal is introduced to the second slot line pattern portion 420 in this state, the signal is distributed to the first and second half loop slot lines 421-3 and 421-4 of the second slot line pattern portion 420, the distributed signals having a phase difference of 180 degrees. These distributed signals are nullified due to the 180-degree phase difference at a position where they are combined. Thus, secondary signal blocking is performed.

Figure 5:
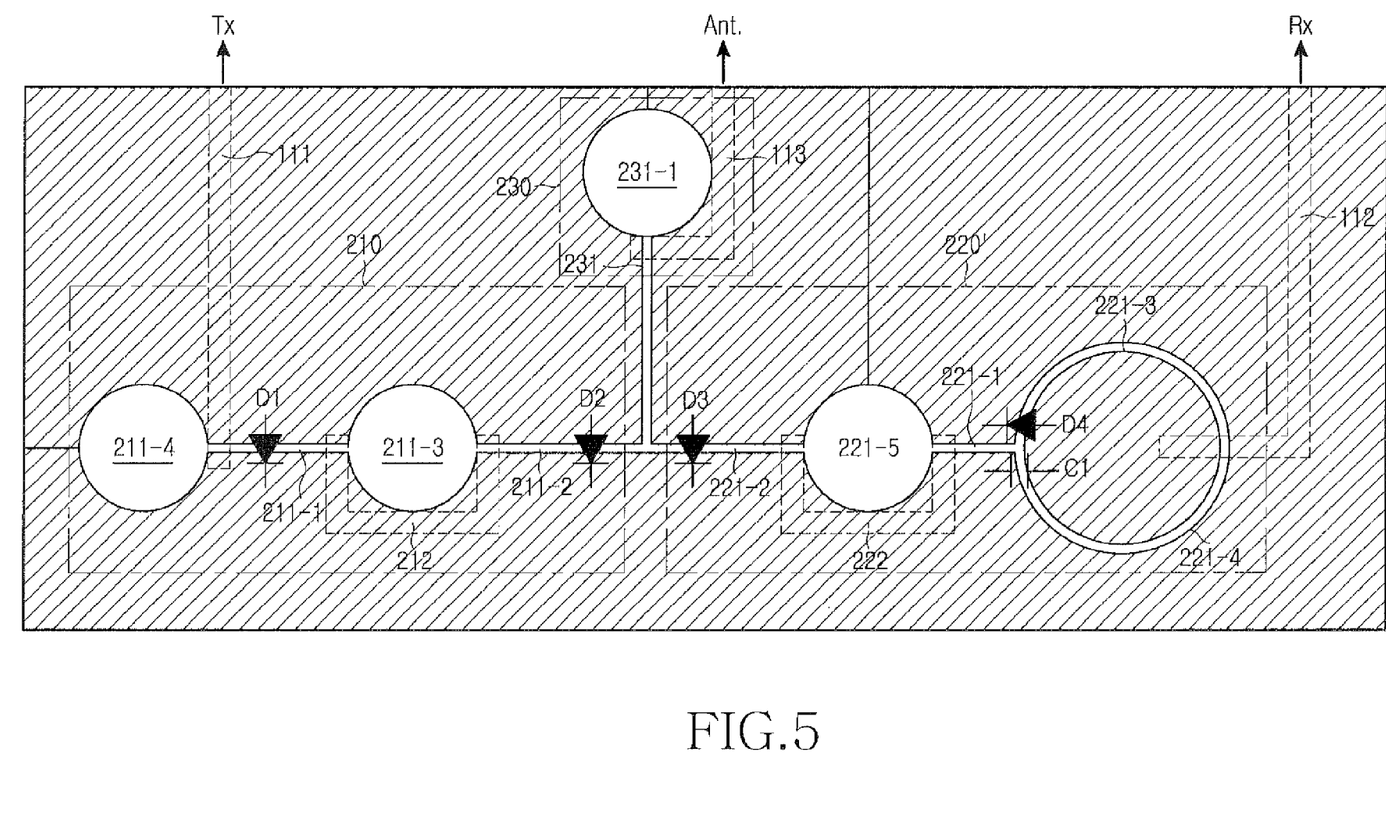
FIG. 5 is a plan view of the circuit pattern of the PCB of an RF switch for Tx-Rx switching in a TDD system according to a third embodiment of the present invention.

FIG. 5 is a plan view of one surface (top surface, for convenience' sake) of the circuit pattern of the PCB of an RF switch for Tx-Rx switching in a TDD system according to a third embodiment of the present invention. The RF switch according to the third embodiment of the present invention is similar to that illustrated in FIGS. 2 and 3 in configuration.

In the RF switch according to the third embodiment of the present invention, the first, second and third microstrip lines 111, 112 and 113 are formed into appropriate patterns on the lower surface of the dielectric substrate. These microstrip lines serve as the first, second and third ports for the RF switch. The first, second and third slot line pattern portions 210, 220' and 230 are formed on the upper surface of the dielectric substrate, such that signals can be transferred at appropriate positions between the first, second and third slot line pattern portions 210, 220' and 230, and the first, second and third microstrip lines 111, 112 and 113 by microstrip slot line coupling. These slot line pattern portions 210, 220' and 230 are connected to one another at one position like a T-junction slot line structure.

While the first and third slot line pattern portions 210 and 230 are identical in configuration to those illustrated in FIGS. 2 and 3, the second slot line pattern portion 220' is different from the second slot line pattern portion 220.

More specifically, the second slot line pattern potion 220' has the loop slot line 221-3 and 221-4 formed by the first half loop slot line 221-3 and the second half slot line 221-4, for transferring a signal from one portion thereof to the second microstrip line 112. The second slot line pattern portion 220' is further provided with a 2-1 sub-slot line 221-1 having one end connected to the other end of the loop slot line 221-3 and 221-4 and a 2-2 sub-slot line 221-2 having one end connected to a connection to the first and third slot line pattern portions 210 and 230. The other ends of the 2-1 sub-slot line 221-1 and the 2-2 sub-slot line 221-2 are connected to both ends of a common open-end circuit 221-5. A sub-microstrip line 222 is formed on the lower surface of the dielectric substrate, at positions corresponding to connections between the 2-1 and 2-2 sub-slot lines 221-1 and 221-2 and the common open end circuit 221-5, such that signal transfer occurs between both ends of the sub-microstrip line 222 and the 2-1 and 2-2 sub-slot lines 221-1 and 221-2 by micro-strip line coupling.

The thus configured second slot line pattern portion 220' is provided with a switching circuit D3 and D4 at an appropriate position of a corresponding slot line pattern, for shorting the gap of a corresponding slot line in response to an external switching control signal and thus blocking a signal.

To be more specific, the switching circuit of the second slot line pattern portion 220' includes a third diode D3 installed at an appropriate position of the 2-2 sub-slot line 221-2, for shorting the gap of the 2-2 sub-slot line 221-2 according to the external switching control signal, and a fourth diode D4 installed, for example, in the vicinity of a connection between the first half loop slot line 221-3 and the 2-1 sub-slot line 221-1, for shorting the gap of the first half loop slot line 221-3 according to the external switching control signal. A capacitor C1 is provided across the gap of the second half loop slot line 221-4 in the vicinity of a connection between the second half loop slot line 221-4 and the 2-1 sub-slot line 221-1.

In the above RF switch of the present invention, a Tx-Rx switch can be implemented for Tx-Rx switching in the TDD system by connecting the first, second and third ports of the first, second and third microstrip lines 111, 112 and 113 to the Tx end, the Rx end, and the Ant. end. The Tx-Rx switch operates in the same manner as in the first embodiment of the present invention illustrated in FIGS. 2 and 3.

The configurations and operations of the RF switches according to the embodiments of the present invention have been described above. While the invention has been shown and described with reference to certain preferred embodiments thereof, they are mere exemplary applications. For example, the second slot line pattern portion 220 illustrated in FIGS. 2 and 3 according to the first embodiment can be exchanged with the first slot line pattern position 420 illustrated in FIG. 4 according to the second embodiment.

The first slot line pattern portion 210 illustrated in FIGS. 2 and 3 can be so adapted that the 1-1 and 1-2 sub-slot lines 211-1 and 211-2 can be connected to each other without the common open-end circuit 211-3 and the sub-microstrip line 212. The first embodiment of the present invention is intended to improve isolation performance by use of the common open-end circuit 211-3 and the sub-microstrip line 212.

Besides, the microstrip lines can be replaced with strip lines, coaxial cables, or Coplanar Waveguides (CPWs). Also, Coplanar Strips may substitute for the slot lines. While diodes are adopted as switching devices in the embodiments, any other semiconductor device with the switching function (e.g. FETs) can be used.

Therefore, it will be understood by those skilled in the art flat various changes in form and details may be made therein without departing from the spirit and scope of the invention as defined by the appended claims.

INDUSTRIAL AVAILABILITY

As described above, the Tx-Rx switching device for a TDD system according to the present invention ensures sufficient isolation between Tx and Rx paths.

Tx power fully reflected and introduced into an Rx end can be remarkably reduced and PIMD is improved, even when an antenna is opened and a problem occurs to a DC power for a control operation.

Since a Tx signal is transferred along a slot line with a sufficient ground plate, high-speed switching is enabled using a semiconductor device and that at a high power level.

Due to easy application in the form of an MIC, the Tx-Rx switching circuit can be fabricated during a general semiconductor process.

Furthermore, the Tx-Rx switch can be used in an RF band of tens of giga hertz or above as well as in a mobile communication frequency band. Therefore, it can be easily applied to satellite communications and military radars.

The invention claimed is:

1. A radio frequency switch comprising:
   first, second and third transmission lines for forming first, second and third ports; and
   first, second and third slot line pattern portions connected to one another, for signal transferring with the first, second and third transmission lines,
   wherein the first slot line pattern portion includes a slot line pattern for providing a signal received from the first transmission line to a connection to the other slot line pattern portions, and a switching circuit installed at a predetermined position of the slot line pattern, for blocking a signal by shorting the gap of a slot line according to an external control signal, and
   wherein the second slot line pattern portion includes a loop slot line formed by a first half loop slot line and a second half loop slot line, for signal transferring between a portion thereof and the second transmission line, a second sub-slot line for providing a signal received from the connection to the other slot line pattern portions to the second transmission line through the loop slot line, and a switching circuit installed at a predetermined position of slot line pattern, for blocking a signal by shorting the gap of a slot line according to an external control signal.

2. The radio frequency switch of claim 1, wherein the slot line pattern of the first slot line pattern portion comprises:
   a loop slot line formed by a first half loop slot line and a second half loop slot line, for signal transferring between a portion thereof and the first transmission line;
   a first sub-slot line for providing a signal received from the loop slot line to the connection to the other slot line pattern portions.

3. The radio frequency switch of claim 2, wherein the switching circuit of the first slot line pattern portion comprises:
   first and second switching devices installed in the vicinity of a connection between the first half loop slot line and the first sub-slot line and a connection between the second half loop slot line and the first sub-slot line, for turning on/off according to the external switching control signal; and a third switching device for turning on/off in the first or second half loop slot line according to the external switching control signal, separately from the first or second switching device.

4. The radio frequency switch of claim 1, wherein the slot line pattern of the first slot line pattern portion comprises:

a 1-1 sub-slot line having an open-end circuit at an end thereof, for signal transferring with the first transmission line;

a 1-2 sub-slot line having one end connected to the connection to the other slot line pattern portions;

a common open-end circuit having both ends connected to the other ends of the 1-1 and 1-2 sub-slot lines; and a sub-microstrip line having both ends in which a signal is transferred to and from connections between the common open-end circuit and the 1-1 and 1-2 sub-slot lines by microstrip-slot line coupling.

5. The radio frequency switch of any of claims 1 to 4, wherein the switching circuit of the second slot line pattern portion comprises:

a switching device installed on the second sub-slot line, for turning on/off according to the external switching control signal; and switching devices installed in the vicinity of connections between the first half loop slot line and the second sub-slot line and between the second half loop slot line and the second sub-slot line, for turning on/off according to the external switching control signal.

6. The radio frequency switch of any of claims 1 to 4, wherein the switching circuit of the second slot line pattern portion comprises:

third and fourth switching devices installed in the vicinity of connections between the first half loop slot line and the first sub-slot line and between the second half loop slot line and the second sub-slot line, for turning on/off according to the external switching control signal; and a sixth switching device for turning on/off according to the external switching control signal on the first or second half loop slot line, separately from the third or fourth switching device.

7. The radio frequency switch of any of claims 1 to 4, wherein the first, second and third transmission lines are one of microstrip lines, strip lines, coaxial lines, and coplanar waveguides (CPWs).

8. The radio frequency switch of any of claims 1 to 4, wherein the switching circuit of the second slot line pattern portion comprises:

third and fourth switching devices installed in the vicinity of connections between the first half loop slot line and the first sub-slot line and between the second half loop slot line and the second sub-slot line, for turning on/off according to the external switching control signal; and a sixth switching device for turning on/off according to the external switching control signal on the first or second half loop slot line, separately from the third or fourth switching device.

9. The radio frequency switch of any of claims 1, 2, 3 and 5, wherein the switching circuit of the second slot line pattern portion comprises:

a switching device installed at the 2-2 sub-slot line, for turning on/off according to the external switching control signal;

a switching device installed in the vicinity of a connection between the first or second half loop slot line and the 2-1 sub-slot line, for turning on/off according to the external switching control signal; and a capacitor installed across the gap of the first or second half loop slot line, facing the switching device installed at the first or second half loop slot line.

10. The radio frequency switch of any of claims 1 to 5, wherein the first, second and third transmission lines are one of microstrip lines, strip lines, coaxial lines, and coplanar waveguides (CPWs).

* * * * *